US009706664B2

(12) United States Patent
Okamoto et al.

(10) Patent No.: US 9,706,664 B2
(45) Date of Patent: Jul. 11, 2017

(54) ELECTRONIC COMPONENT MOUNTING SYSTEM AND ELECTRONIC COMPONENT MOUNTING METHOD

(71) Applicant: Panasonic Corporation, Osaka (JP)

(72) Inventors: Kenji Okamoto, Yamanashi (JP); Masahiro Kihara, Yamanashi (JP); Katsuhiko Itoh, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 476 days.

(21) Appl. No.: 14/297,755

(22) Filed: Jun. 6, 2014

(65) Prior Publication Data

US 2014/0373346 A1    Dec. 25, 2014

(30) Foreign Application Priority Data

Jun. 25, 2013    (JP) .................................. 2013-132235

(51) Int. Cl.
*H05K 3/30*    (2006.01)
*H05K 3/12*    (2006.01)
(Continued)

(52) U.S. Cl.
CPC ....... *H05K 3/1233* (2013.01); *H05K 13/0465* (2013.01); *H05K 3/341* (2013.01);
(Continued)

(58) Field of Classification Search
CPC .. H05K 3/1233; H05K 13/0465; H05K 3/341; H05K 2203/166; H05K 2203/163;
(Continued)

(56) References Cited

U.S. PATENT DOCUMENTS 5,822,210 A * 10/1998 Kobayashi .............. H01L 22/20
700/121
6,757,966 B2 * 7/2004 Inoue ................. H05K 13/0465
29/740
(Continued)

FOREIGN PATENT DOCUMENTS

JP    2002-271096 A    9/2002
JP    2006-319378 A    11/2006
(Continued)

OTHER PUBLICATIONS

Japanese Office Action issued in Patent Application No. JP 2013-132235 dated Nov. 8, 2016.

*Primary Examiner* — Donghai D Nguyen
(74) *Attorney, Agent, or Firm* — Pearne & Gordon, LLP

(57) ABSTRACT

An electronic component mounting system includes a screen printing device, an inspection device, an electronic component mounting device, a feedback part that generates, based on inspection data formed by the inspection device, first information about corrections on control parameters pertinent to positioning of a mask to a substrate in the screen printing device, and a feedforward part that generates, based on the inspection data, second information about corrections on electronic component mount coordinates in the electronic component mounting device. The feedback part generates the first information based on the first print displacement value. The feedforward part generates the second information based on the second print displacement value.

10 Claims, 15 Drawing Sheets

(51) Int. Cl.
*H05K 13/04* (2006.01)
*H05K 3/34* (2006.01)

(52) U.S. Cl.
CPC . *H05K 2203/163* (2013.01); *H05K 2203/166* (2013.01); *Y10T 29/49117* (2015.01); *Y10T 29/53022* (2015.01)

(58) Field of Classification Search
CPC ............... H01L 22/20; Y10T 29/53022; Y10T 29/53178; Y10T 29/49117; Y10T 29/49133; Y10T 29/49144
USPC .................. 29/832–834, 840, 709, 739, 740; 700/117, 121
See application file for complete search history.

(56) References Cited

U.S. PATENT DOCUMENTS

| | | |
|---|---|---|
| 2002/0157488 A1 | 10/2002 | Nagafuku et al. |
| 2005/0077340 A1 | 4/2005 | Nagafuku et al. |

FOREIGN PATENT DOCUMENTS

| | | |
|---|---|---|
| JP | 2007-096022 A | 4/2007 |
| JP | 2008-199070 A | 8/2008 |
| JP | 2011-171343 A | 9/2011 |

* cited by examiner

ELECTRONIC COMPONENT MOUNTING SYSTEM AND ELECTRONIC COMPONENT MOUNTING METHOD

CROSS REFERENCE TO RELATED APPLICATION(S)

The present disclosure relates to the subject matters contained in Japanese Patent Application No. 2013-132235 filed on Jun. 25, 2013, which are incorporated herein by reference in its entirety.

FIELD

One exemplary embodiment of the present invention relates to an electronic component mounting system and an electronic component mounting method for mounting electronic components on a substrate.

BACKGROUND

An electronic component mounting system that manufactures a mounted board by soldering electronic components to a board is built by joining together a plurality of electronic component mounting devices, like a printing device, a print inspection device, and an electronic component mounting device. In relation to such an electronic component mounting system, a hitherto known position correction technique of actually measuring positions of solders and transmitting the thus-acquired solder position information to another component mounting device is intended to prevent mounting failures, which would otherwise be caused by positional displacement of printed solders from electrodes formed on a substrate for soldering purpose (see Patent Document 1, for instance).

In an example provided in Patent Document 1, the print inspection device calculates an amount of positional displacement of solder sections from a pair of electrode areas, to thus determine displacement from normal positions. The thus-acquired displacement data are fed back to the printing device and fed forward to the electronic component mounting device. The printing device makes corrections to control parameters to be employed during printing operation, according to the thus-received displacement data, thereby reducing the amount of position displacement occurred during printing operation.

Further, the electronic component mounting device makes a correction to electronic component mount coordinates in accordance with the received displacement data, and mounts the electronic components with reference to positions of actually printed solder sections. The electronic components are thereby soldered to the correct positions by utilization of a so-called self-alignment effect of the electronic components being pulled to the respective electrodes by dint of surface tension of molten solder in a reflow process after the components are mounted.

Patent Document 1 is JP-A-2008-199070.

SUMMARY

However, in the related art, deviation data generated based on positions of all solder sections printed on a substrate are fed back, like an average amount of positional displacement of all the solder sections printed on the substrate being used as a deviation. As a consequence, assuring print quality has become insufficient in the case of a ceramic substrate that is prone to warpage and a substrate that includes in part electronic component mount positions entailing a high degree of difficulty in mounting, like a substrate including a fine pitch area where fine spacing exists between adjacent electronic component mount positions.

Specifically, if a substrate, such as that mentioned above, is subjected to printing in accordance with the deviation data, the positional displacement of the solder sections will be entirely eliminated. However, positional displacement that cannot be overlooked still exists in the electronic component mount positions entailing a high degree of difficulty in mounting, and a situation in which mounting failures easily occur cannot be eliminated. As above, a positional correction technique of the related-art electronic component mounting system cannot be said to have been sufficient for a warped substrate and a substrate that includes in part electronic component mount positions entailing a high degree of difficulty in mounting.

Consequently, the embodiment of the present invention aims at providing an electronic component mounting system and an electronic component mounting method that address a warped substrate or a substrate that includes in part electronic component mount positions entailing a high degree of difficulty in mounting.

An electronic component mounting system of the embodiment is an electronic component mounting system that mounts electronic components at a plurality of electronic component mount positions including a first electronic component mount position and a second electronic component mount position on a substrate, to thus manufacture a mounted substrate, the system including: a screen printing device that positions a mask in which a plurality of apertures are formed to the substrate and that forms solder sections on electrodes formed at the plurality of electronic component mount positions on the substrate via the apertures; an inspection device that inspects the substrate on which the solder sections are formed and that generates inspection data including print displacement values of the solder sections at the plurality of electronic component mount positions, the print displacement values including a first print displacement value at the first electric component mount position and a second print displacement value at the second electric component mount position; an electronic component mounting device that mounts electronic components at the plurality of electronic component mount positions on the substrate having finished undergoing inspection in the inspection device; a feedback part that generates, based on the inspection data, first information about corrections on control parameters pertinent to positioning of the mask to the substrate in the screen printing device; and a feedforward part that generates, based on the inspection data, second information about corrections on electronic component mount coordinates in the electronic component mounting device, wherein the feedback part generates, based on the first print displacement value at the first electronic component mount position, the first information about the corrections on the control parameters pertinent to positioning of the substrate to the mask, and the feedforward part generates, based on the second print displacement value at the second electronic component mount position, the second information about the corrections on the electronic component mount coordinates in the electronic component mounting device.

An electronic component mounting method of the embodiment is an electronic component mounting method for manufacturing a mounted substrate by mounting electronic components on a substrate by an electronic component mounting system that mounts the electronic components on the substrate at a plurality of electronic component mount positions including a first electronic component mount position and a second electronic component mount position, to thus manufacture the mounted substrate, the method including: a solder section formation step of positioning the mask in which a plurality of apertures are formed to the substrate and forming solder sections on electrodes formed at the plurality of electronic component mount positions set on the substrate via the apertures; an inspection data generation step of inspecting the substrate on which the solder sections are formed and generating inspection data including print displacement values of the solder sections at the plurality of electronic component mount positions, the print displacement values including a first print displacement value at the first electric component mount position and a second print displacement value at the second electric component mount position; an electronic component mount step of mounting electronic components at the plurality of electronic component mount positions on the substrate having finished undergoing inspection; a feedback processing step of generating, based on the inspection data, information about corrections on control parameters pertinent to positioning of the mask to the substrate in the solder section formation step are formed; and a feedforward processing step of generating, based on the inspection data, information about corrections on electronic component mount coordinates in the electronic component mount step, wherein in the feedback processing step, the information about the corrections on the control parameters pertinent to positioning of the substrate to the mask is formed, based on the first print displacement value at the first electronic component mount position, and in the feedforward processing step, the information about the corrections of the electronic component mount coordinates in the electronic component mounting device is formed, based on the second print displacement value at the second electronic component mount position.

According to the embodiment, the feedback means generates the first information about the corrections on the control parameters pertinent to positioning of the substrate to the mask based on the first print displacement value at the first electronic component mount position, and the feedforward means generates the second information about the corrections on electronic component mount coordinates in the electronic component mounting device based on the second print displacement value at the second electronic component mount position. Hence, it is possible to appropriately address a warped substrate and a substrate that has in part electronic component mount positions entailing a high degree of difficulty in mounting.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Figure 1:
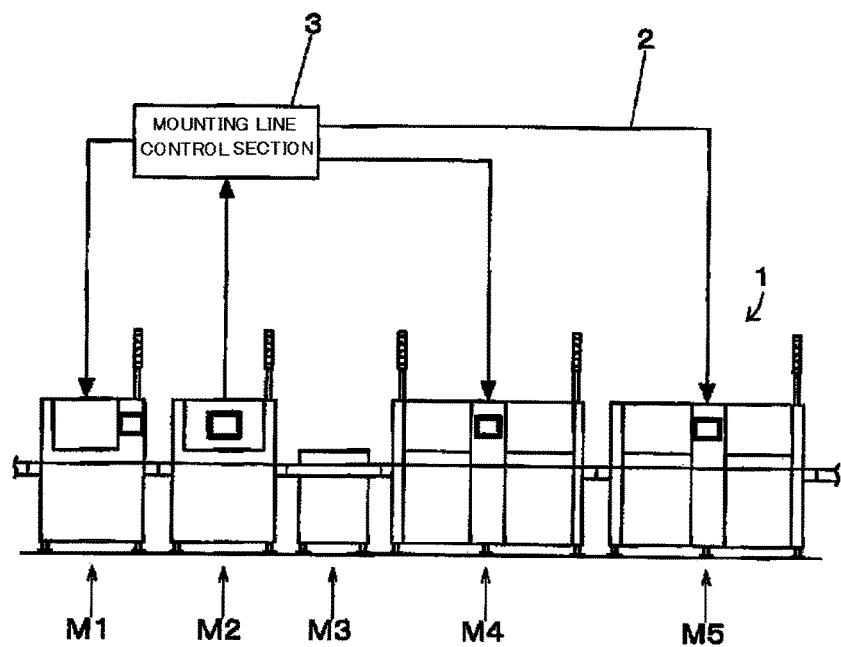
FIG. 1 is an entire configuration diagram of an electronic component mounting system of an embodiment of the invention.

An entire configuration of an electronic component mounting system of an embodiment of the present invention first described by reference to FIG. 1. An electronic component mounting system 1 is configured by interconnecting, through a communication network 2, an electronic component mounting line made by linkage of a printing machine M1, a print inspection machine M2, a work conveyor M3, and mounting machines M4 and M5, and controls the entire electronic component mounting line by a mounting line control section 3.

The printing machine (a screen printing device) M1 puts, by means of screen printing, paste solder on electrodes that are formed on a substrate for the purpose of bonding electronic components, thereby forming solder sections on the electrodes. The print inspection machine (inspection device) M2 performs print inspection including a determination about whether a printed state of the solder sections is defective or non-defective and detection of a print displacement of the solder sections on the electrodes. The work conveyor M3 conveys a substrate determined to have a superior state of being printed to the mounting machine M4 located at a downstream position. Transport of the substrate determined to have a defective state of being printed is stopped, and an operator takes out the substrate from the line. The mounting machines M4 and M5 (the electronic component mounting devices) mount electronic components at electronic component mount positions on the substrate on which the solder sections are formed. Subsequently, the substrate on which the electronic components are mounted is delivered to a (unillustrated) reflow machine, where the substrate is heated in accordance with a predetermined temperature profile. Solder particles contained in the solder section are melted by heating, whereby the electronic components and the substrate are soldered.

Figure 3:
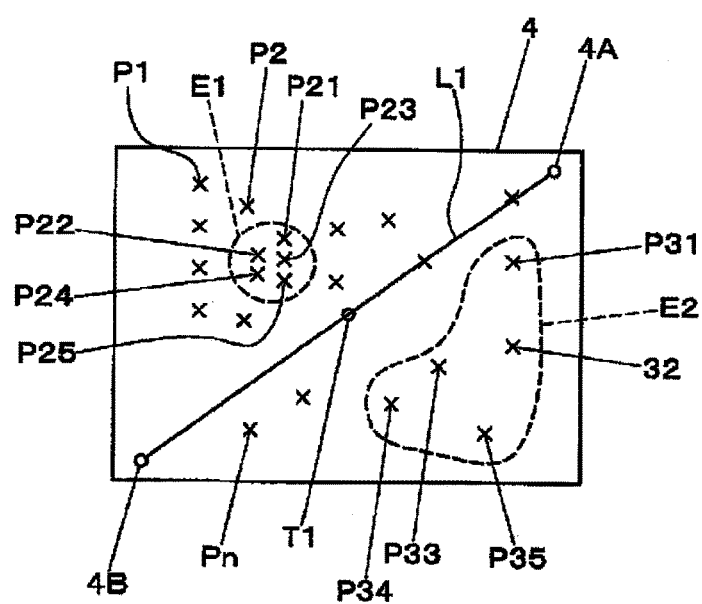
FIG. 3 is a plan view of a substrate of the embodiment of the present invention.
Figure 4:
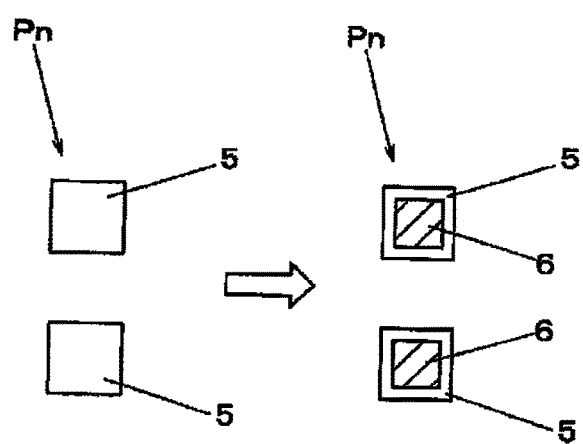
FIG. 4 is an explanatory view of electronic component mount positions of the embodiment of the present invention.

By reference to FIGS. 3 and 4, a substrate on which electronic components are to be mounted is now described. A substrate 4 is made from a material, like ceramic, and a plurality of electronic component mount positions P1, P2, P3, . . . , Pn are put on an upper surface of the substrate. As illustrated in FIG. 4, a pair of electrodes 5 are formed at the electronic component mount position Pn. In terms of a design value, a solder section 6 is formed on each of the pair of electrodes 5. A narrowly adjacent area E1 and a wide spacing area E2 coexist on the substrate 4 according to its type. For instance, the narrowly adjacent area E1 includes narrow spacing, like spacing among electronic component mount positions P21, P22, P23, P24, and P25, and the wide spacing area E2 includes wide spacing, like spacing among electronic component mount positions P31, P32, P33, P34, and P35.

Substrate recognition marks 4A and 4B are formed at respective corners situated at both ends of a diagonal line of the substrate 4. The substrate recognition marks 4A and 4B are utilized as reference marks that enable the printing machine M1 and the mounting machines M4 and M5 to recognize the position of the substrate 4. An inclination of a line segment L1 that connects the substrate recognition marks 4A and 4B to each other is utilized as a numerical value that represents a gradient of the substrate 4 in a horizontal plane.

Figure 5:
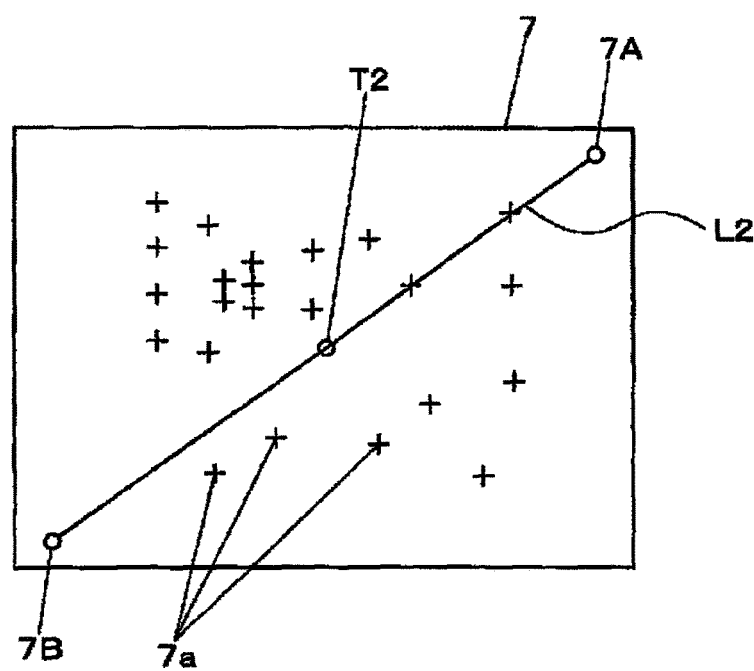
FIG. 5 is a plan view of a mask provided in a screen printing machine of the embodiment of the present invention.

A mask used in the printing machine M1 is now described. In FIG. 5, apertures (omitted from the drawings) used for printing solder at aperture pattern formation positions 7a corresponding to the plurality of electronic component mount positions Pn on the substrate 4 are formed in a mask 7. Mask recognition marks 7A and 7B are formed at respective corners situated at both ends of a diagonal line of the mask 7. The mask recognition marks 7A and 7B are utilized as reference marks that enable the printing machine M1 to recognize the position of the mask 7. An inclination of a line segment L2 that connects the mask recognition marks 7A and 7B to each other is utilized as a numerical value that represents a gradient of the mask 7 within the horizontal plane.

Figure 6:
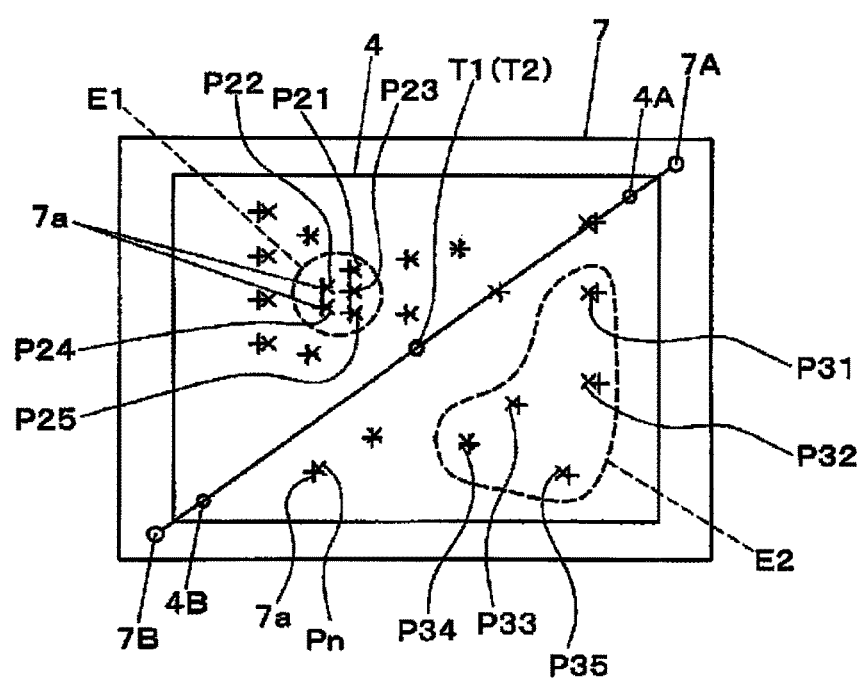
FIG. 6 is an explanatory view of operation for positioning the substrate to the mask in the embodiment of the present invention.

The line segment L1 that connects the substrate recognition marks 4A and 4B and the line segment L2 that connects the substrate recognition marks 7A and 7B are superimposed one on another in the vertical direction. In addition, a middle point T1 of the line segment L1 and a middle point T2 of the line segment L2 are brought into agreement with each other, whereby the positions of the electrodes 5 and the positions of the respective apertures coincide with each other from a design viewpoint. However, actually, nominal displacement exists between the positions of the apertures and the positions of the electrodes 5 as illustrated in FIG. 6 at an actual site of mounting electronic components because of variations in manufacture of the substrate 4.

The printing machine M1 is now described. The printing machine M1 is equipped with a recognition device for recognizing positions of the substrate recognition marks 4A and 4B and positions of the mask recognition marks 7A and 7B, a substrate holding section for holding the substrate 4, a positioning mechanism for positioning the substrate 4 held by the substrate holding section to the mask 7, a print head having a squeegee for rolling paste solder over the mask 7, and a control section for controlling operation of the entire machine. When the mask 7 used for printing operation is set, the printing machine M1 recognizes the mask recognition marks 7A and 7B by means of the recognition device, storing in the control section information about positions of the recognition marks 7A and 7B of the mask 7, the position of the middle point T2, and the gradient of the line segment L2 in the printing machine M1.

In printing operation, the substrate 4 is first carried into the substrate holding section, and the recognition device subsequently recognizes the substrate recognition marks 4A and 4B on the substrate 4, thereby determining the position of the middle point T1 and the inclination of the line segment L1 in the printing machine M1. On the basis of the information about the middle points T1 and T2 and the line segments L1 and L2 and preliminarily stored control parameters pertaining to positioning of the mask 7 to the substrate 4 (hereinafter referred to simply as "control parameters"), the positioning mechanism for moving the substrate 4 in a predetermined direction or horizontally rotating the same is controlled, thereby positioning the substrate 4 to the mask 7. The squeegee is slidably moved over the mask 7 supplied with paste solder, whereby the solder sections 6 are formed on the respective electrodes 5 via the apertures of the mask 7.

As above, the printing machine M1 has a function of positioning the mask 7 in which a plurality of apertures are formed to the substrate 4 and forming, via the apertures, the solder sections 6 on the respective electrodes 5 made at the plurality of electronic component mount positions Pn set on the substrate 4.

Figure 9:
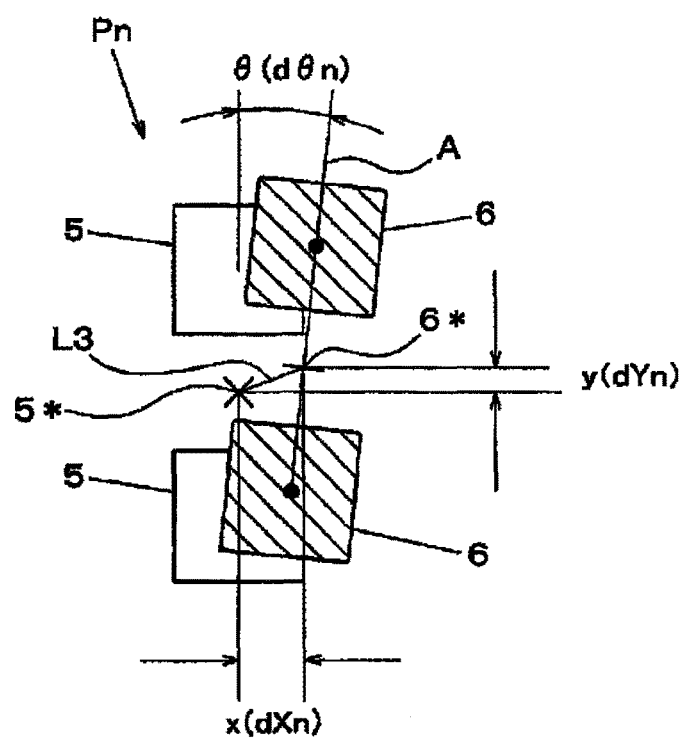
FIG. 9 is an explanatory view of positional displacement of solder sections from electrodes formed on the substrate in the embodiment of the present invention.

The print inspection machine M2 has a horizontally movable inspection camera. An image of the substrate 4 on which the solder has been printed is captured, and print displacement values of the solder sections 6 with respect to the electrodes 5 are determined from the thus-captured image data. As illustrated in FIG. 9, the print displacement value of the solder sections 6 is represented by components "x" and "y," in two horizontal directions of a positional displacement line L3, which represent amounts and directions of positional displacement and an angle of displacement $\theta$ which a direction line A represented by a pair of solder sections 6 forms with a reference direction (a layout direction of the electrodes 5).

A recognition processing section of the print inspection machine M2 performs processing for recognizing data pertaining to a captured image of the substrate 4, whereby position data representing solder print coordinates 6* of the pair of solder sections 6 are determined as solder print coordinates SPn (SXn, SYn) with reference to the substrate recognition mark 4A. In relation to an x-direction, a y-direction, and the angle $\theta$, displacements (dXn, dYn, and d$\theta$n) between the solder print coordinates SPn (SXn, SYn) and component mount coordinates (design values) 5* (Xn, Yn) of the pair of electrodes 5 on the substrate 4 determined with reference to the substrate recognition mark 4A are calculated as a print displacement value of the electronic component mount positions Pn.

Figure 10:
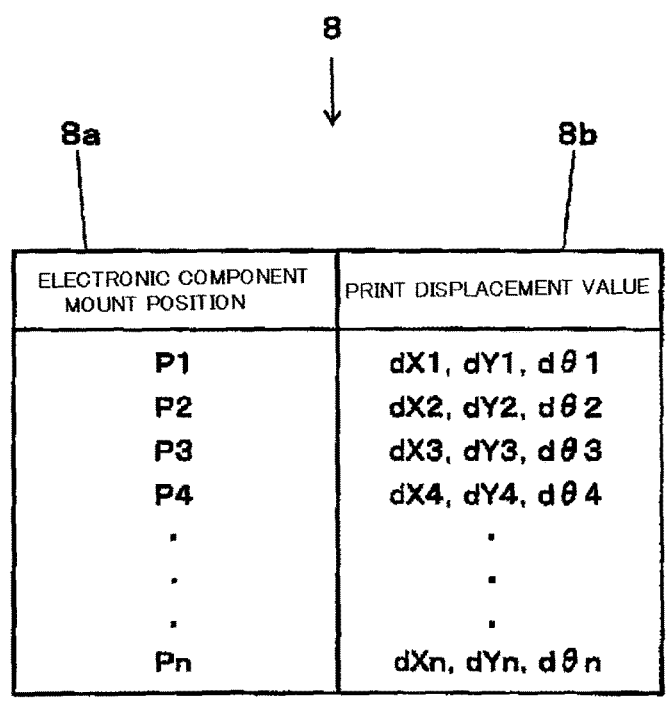
FIG. 10 is an explanatory view of inspection data in the embodiment of the present invention.

Print displacement values of the pair of solder sections 6 at all the electronic component mount positions Pn on the substrate 4 are calculated by the foregoing method. An arithmetic processing section of the print inspection machine M2 thereby generates inspection data 8 illustrated in FIG. 10 which includes information showing "electronic component mount positions" 8a (P1, P2, . . . ) and "print displacement values" 8*b* ((dX1, dY1, dθ1), (dX2, dY2, dθ2) . . . ) corresponding to the electronic component mount positions Pn. As above, the print inspection machine M2 has a function of generating the inspection data 8 including information about the print displacement values of the solder sections 6 at the plurality of electronic component mount positions Pn, by inspection of the substrate 4 on which the solder sections 6 are formed.

Each of the mounting machines M4 and M5 has a component feed section for feeding electronic components, a substrate conveyance positioning section for conveying the substrate 4 that has finished undergoing inspection in the print inspection machine M2 and positioning the substrate 4 at a predetermined work position, a camera for capturing an image of the substrate, a mount head having nozzles for picking up the electronic components by suction, and a mount control section for mounting the electronic components by controlling each of the mechanisms.

In mounting operation, identification information (e.g., a serial number) about the substrate carried in the substrate conveyance positioning section is first confirmed. The identification information is confirmed under a method for reading a bar code, or the like, provided on the substrate 4 by means of a reader of each of the mounting machines M4 and M5 or a method for receiving identification information about the substrate transmitted from the mounting line control section 3 by means of the mount control section of each of the mounting machines M4 and M5. The mounting machines M4 and M5 perform substrate recognition which includes capturing images of the substrate recognition marks 4A and 4B provided on the substrate 4 with the cameras, recognizing the marks, and determining the position of the substrate 4 in each of the mounting machines M4 and M5. Subsequently, the electronic components are picked up from the component feed section by means of nozzles, and the mount control section controls the mount head in accordance with the preliminarily stored mount data; namely, information about coordinates where electronic components are to be mounted (component mount coordinates 5*) and the position of the substrate determined by substrate recognition, whereby the mount head is moved to the predetermined electronic component mount positions Pn on the positioned substrate 4. The nozzle is lowered to the substrate 4, thereby mounting the electronic components on the substrate 4.

As above, the mounting machines M4 and M5 each have a function of mounting the electronic components at the plurality of electronic component mount positions Pn on the substrate 4 that has finished undergoing inspection in the print inspection machine M2. The electronic component mounting system including the printing machine M1, the print inspection machine M2, and the mounting machines M4 and M5 has a function of mounting the electronic components at the respective electronic component mount positions Pn on the substrate 4, to thus manufacture a mounted substrate.

Figure 2:
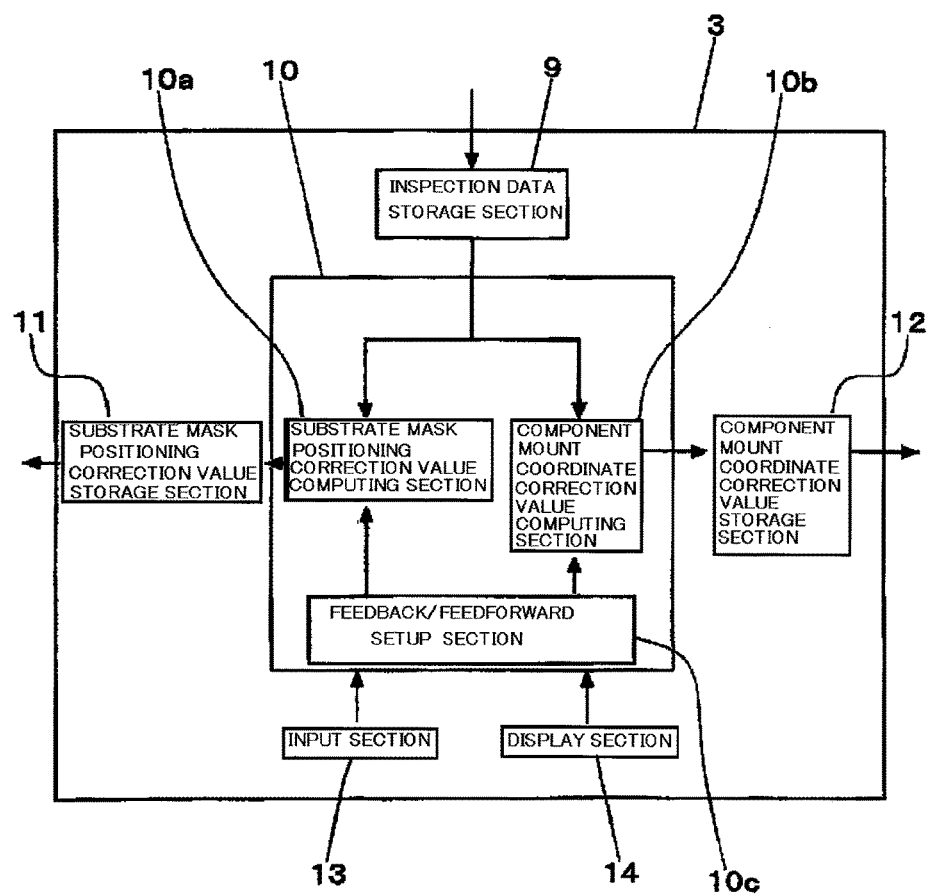
FIG. 2 is a block diagram showing a configuration of a control system of the electronic component mounting system of the embodiment of the present invention.

By reference to FIG. 2, the mounting line control section 3 is now described. The mounting line control section 3 includes an inspection data storage section 9, an arithmetic processing section 10, a substrate mask positioning correction value storage section 11, and a component mount coordinate correction value storage section 12. The arithmetic processing section 10 has, as internal processing functions, a substrate mask positioning correction value computing section 10*a*, a component mount coordinate correction value computing section 10*b*, and a feedback/feedforward setup section 10*c*. In addition, the arithmetic processing section 10 is externally connected to an input section 13 and a display section 14.

The inspection data storage section 9 stores the inspection data 8 output from the print inspection machine M2. The substrate mask positioning correction value computing section 10*a* computes, from the "print displacement value" 8*b* included in the inspection data 8 stored in the inspection data storage section 9, a "substrate mask positioning correction value" which is used when the printing machine M1 positions the mask 7 to the substrate 4, generating "substrate mask positioning correction value data" including the correction value. After being stored in the substrate mask positioning correction value storage section 11, the substrate mask positioning correction value data are fed back to the printing machine M1 located at an upstream position. After making corrections to the control parameters in accordance with the substrate mask positioning correction values included in the substrate mask positioning correction value data, the printing machine M1 positions the mask 7 to the substrate 4.

As above, the substrate mask positioning correction value data are taken as "information about corrections on the control parameters pertinent to positioning the mask 7 to the substrate 4" in the printing machine M1. The substrate mask positioning correction value computing section 10*a* serves as feedback means in the printing machine M1 for generating, from the inspection data 8, information about corrections on the control parameters pertinent to positioning the mask 7 to the substrate 4. The substrate mask positioning correction value is hereunder referred to as an "FB value." In this regard, the FB value can also be output directly to the printing machine M1 without being stored in the substrate mask positioning correction value storage section 11.

Figure 14:
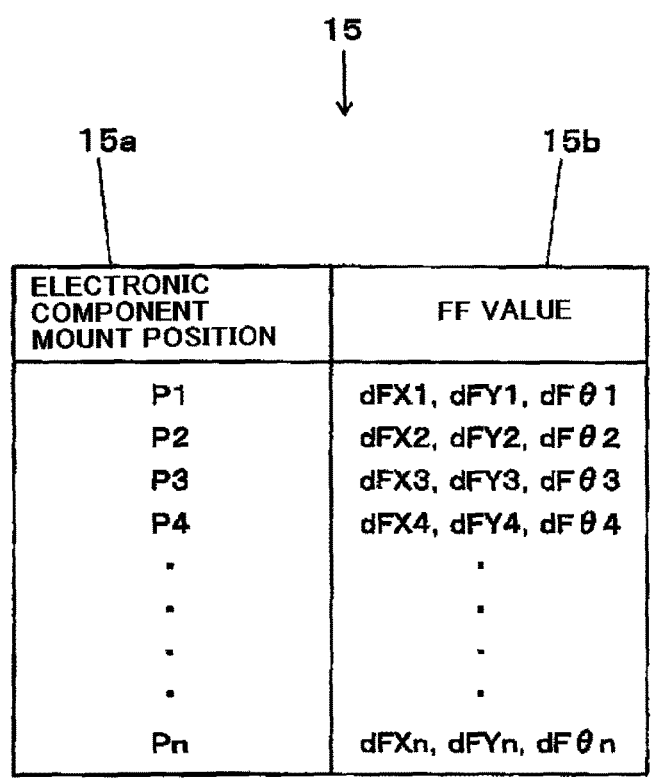
FIG. 14 is an explanatory view of an electronic component mount coordinate correction file generated in the electronic component mounting system of the embodiment of the present invention.

The component mount coordinate correction value computing section 10*b* computes a "component mount coordinate correction value" for each electronic component mount position Pn from information about "print displacement value" 8*b* included in the inspection data 8 stored in the inspection data storage section 9. There is generated a "component mount coordinate correction file" 15 including information, illustrated in FIG. 14, which represents "electronic component mount positions" 15*a* (P1, P2, . . . ) and "component mount coordinate correction values" 15*b* ((dFX1, dFY1, dFθ1), (dFX2, dFY2, dFθ2), . . . ) applied to the electronic component mount position Pn.

The component mount coordinate correction file 15 is generated for each substrate 4 and stored in the component mount coordinate correction value storage section 12 while being associated with the identification information about each of the substrates 4. The thus-stored component mount coordinate correction file 15 is fed forward in accordance with a request from the mounting machines M4 and M5. In accordance with results of confirmation of the identification information, the mounting machines M4 and M5 access the component mount coordinate correction value storage section 12, thereby reading a corresponding component mount coordinate correction file 15. A correction is made to the component mount coordinates 5* in accordance with the "component mount coordinate correction value" 15*b* included in the component mount coordinate correction file 15 and then the electronic component is mounted to the substrate 4.

As above, the component mount coordinate correction file 15 is taken as "information about corrections on electronic component mount coordinates" in each of the mounting machines M4 and M5. The component mount coordinate correction value computing section 10*b* serves as feedforward means that generates from the inspection data 8 information about corrections on the electronic component mount coordinates in the respective mounting machines M4 and M5. A component mount coordinate correction value is hereinafter referred to as an "FF value."

The feedback/feedforward setup section 10*c* receives an input from the operator via the input section 13 and sets various conditions concerning the FB value, one or a plurality of electronic component mount positions Pn used during generation of the component mount coordinate correction file 15, and a coefficient (weight) multiplied by a print displacement value. To be specific, the feedback/feedforward setup section 10*c* has a function of setting, according to the input from the operator, the print displacement value (dXn, dYn, dθn) of which one of the electronic component mount positions Pn and a weight level for use in generating the FB value and the component mount coordinate correction file 15. Therefore, the substrate mask positioning correction value computing section 10*a* generates the FB value from the print displacement value of a part of the electronic component mount positions Pn specified by the feedback/feedforward setup section 10*c*. The component mount coordinate correction value computing section 10*b* generates the component mount coordinate correction file 15 from the FF value pertinent to the electronic component mount position Pn specified by the feedback/feedforward setup section 10*c*. In this case, FF values of the unspecified electronic component mount positions Pn are recorded as zero in the component mount coordinate correction file 15.

The input section 13 is input means, such as a touch panel and a mouse, and performs an input of various conditions, like the FB value and the electronic component mount positions Pn and a weight used for generating the component mount coordinate correction file 15. The display section 14 is a display panel, like a liquid crystal panel, and displays a screen (a setup screen) for setting the FB value and various conditions for generating the component mount coordinate correction file 15, through display processing performed by the arithmetic processing section 10.

Figure 11:
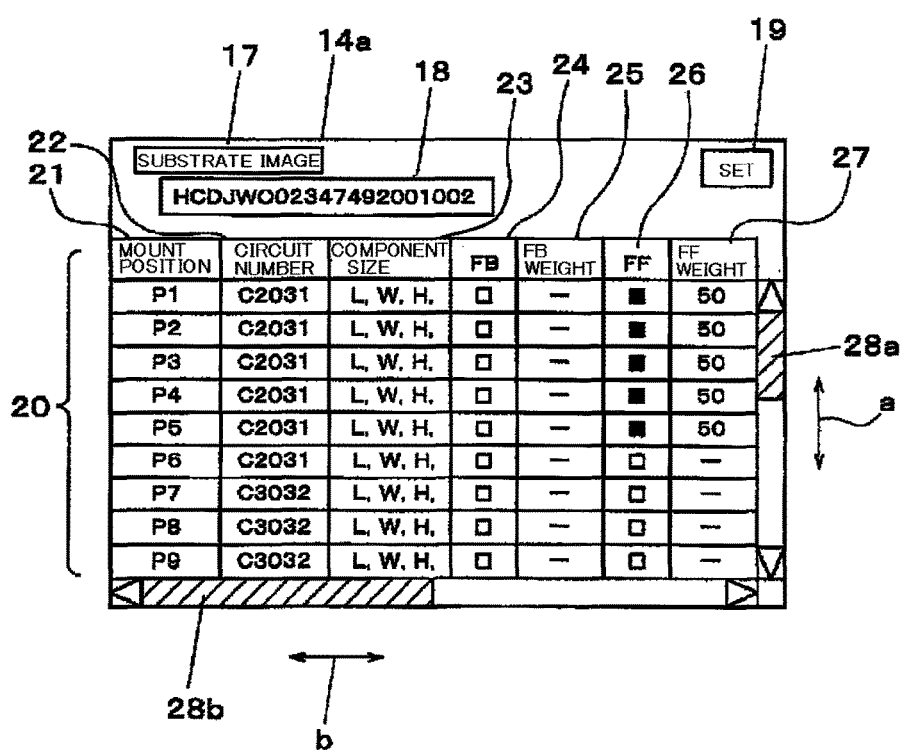
FIG. 11 is a diagram showing a screen that is displayed in a display section when a feedback/feedforward setup section of the embodiment of the present invention is activated.
Figure 12:
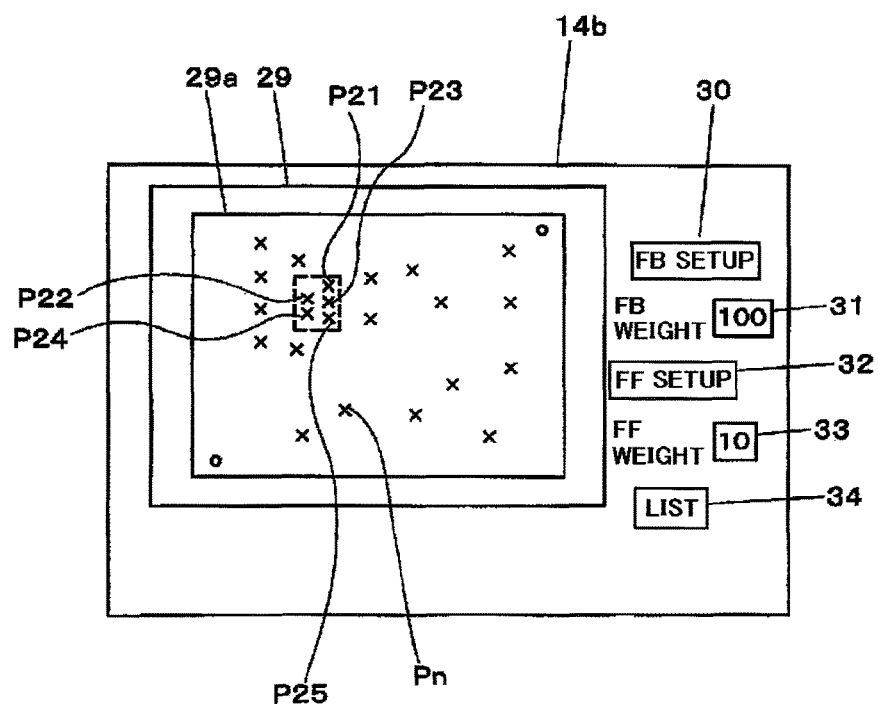
FIG. 12 is a diagram showing the screen that is displayed in the display section when the feedback/feedforward setup section of the embodiment of the present invention activated.
Figure 13:
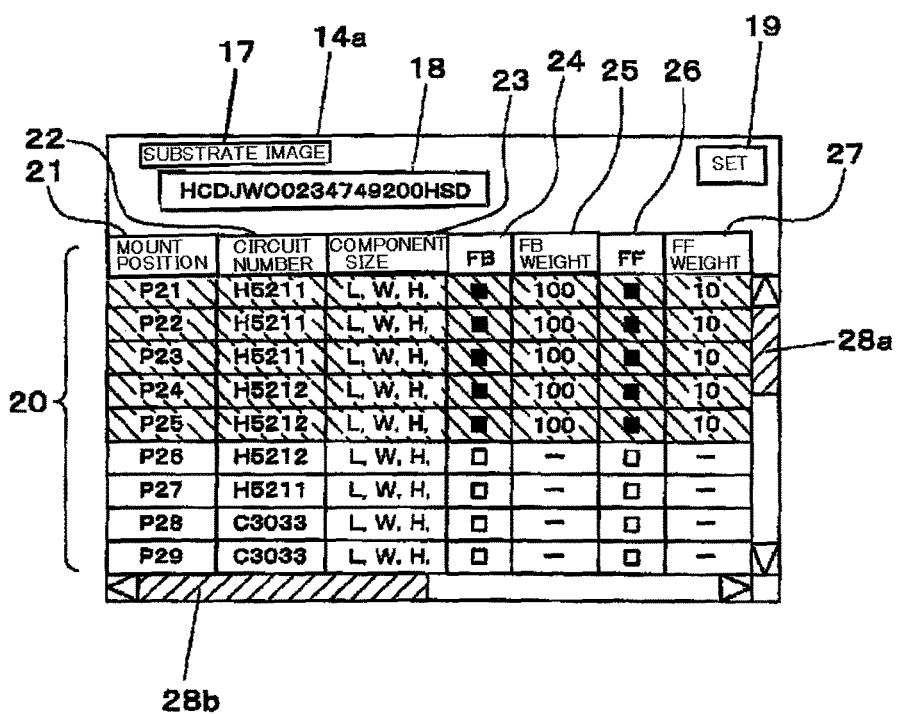
FIG. 13 is a diagram showing the screen that is displayed in the display section when the feedback/feedforward setup section of the embodiment of the present invention is activated.

Details of the setup screen displayed on the display section 14 are now described by reference to FIG. 11, FIG. 12, and FIG. 13. FIG. 11 illustrates a mount position list screen 14*a* that is one setup screen displayed in the display section 14 at the time of activation of the feedback/feedforward setup section 10*c*.

The mount position list screen 14*a* is used as a setup screen when the electronic component mount position Pn to be computed is selected by reference to various pieces of information for each electronic component mount position Pn. The mount position list screen 14*a* displays information including a "substrate image" 17, a "substrate name" 18, a "set" 19, and "mount position list information" 20. The "substrate image" 17 is an operation switch for displaying on the screen a mount position selection screen 14*b* that is one setup screen illustrated in FIG. 12. The "substrate name" 18 shows a name (model name) of the substrate 4 that is to be a target of setting. The "set" 19 is an operation switch for completing setting of various conditions for the substrate mask positioning correction value computing section 10*a* and the component mount coordinate correction value computing section 10*b*.

The "mount position list information" 20 is a list display of various pieces of information for each electronic component mount position Pn and includes information about a "mount position" 21, a "circuit number" 22, a "component size" 23, an "FB" 24, an "FB weight" 25, an "FF" 26, and an "FF weight" 27. One row corresponds to one electronic component mount position Pn. Part of the "mount position list information" 20 hidden behind margins of the screen can be shown by scrolling in the vertical direction a scroll bar 28*a* indicated on one side (a right side on a sheet) of the list (as designated by arrow "a") or scrolling in the horizontal direction a scroll bar 28*b* indicated on a lower position of the list (as designated by arrow "b").

The "mount position" 21 shows identification information for specifying the electronic component mount positions P1, P2, . . . Pn on the substrate 4. The "circuit number" 22 shows a circuit number assigned to the electronic component mount position Pn. The "component size" 23 shows a size of the electronic component 16 mounted at the electronic component mount position Pn; specifically, "L (length)," "W (Width)," and "H (Height)." The "circuit number" 22 and the "component size" 23 are information which the operator refers to when setting a first electronic component mount position and a second electronic component mount position to be described later. Work efficiency is enhanced by displaying these pieces of information on the mount position list screen 14*a*.

The "FB" 24 is a check box for setting whether to use the electronic component mount position Pn for computing the FB value. An inside of the check box turns black or white as a result of the check box is operated (clicked). The check box is operated to thus turn its inside into black, whereby a corresponding electronic component mount position Pn is set as a first component mount position used for computing the FB value.

At least electronic component mount positions entailing a high degree of difficulty in positioning are included in the electronic component mount positions Pn to be set as the first electronic component mount position. For instance, electrodes to which micro-components, like 0402 chips and Chip Size Packages (CSPs), are to be mounted; namely, electronic component mount positions Pn where the electrodes 5 that are classified into a group occupying a relatively small area in the substrate 4 are located, are included in the first electronic component mount position. Further, electronic component mount positions which have relatively small spacing in the substrate 4, like the electronic component mount positions P21 to P25, or electronic component mount positions having the highest degree of density in the substrate 4, are included in the first electronic component mount position.

A weight of the print displacement value used for computing an FB value is input within a range from 1 to 100(%) into a field of the "FB weight" 25. For instance, when a value of "50" is input to the field of the "FB weight" 25, a value determined by multiplying a numeral representing the print displacement value by 50% is used for computing an FB value. As above, a coefficient that is to be multiplied by the print displacement value and that is used for generating information about corrections on control parameters pertaining to positioning between the mask 7 and the substrate 4 can be set for each electronic component mount position Pn through the setup screen.

The "FF" 26 is for displaying check boxes used for setting whether to compute an FF value for the electronic component mount position Pn. When the check box is operated (clicked), the inside of the box turns into "black" or "white." The inside of the check box is turned into back by operating the check box, whereby a corresponding electronic component mount position Pn is set as a second electronic component mount position for which the FF value is to be calculated.

The "FF weight" 27 is a field for inputting a weight of the print displacement value used for computing the FF value within a range from 1 to 100(%). To be more specific, the FF value is computed by multiplying the print displacement value by a weight (%). For instance, when a value of "50" is input to the field of the "FF weight" 27, a value determined by multiplying a numeral representing the print displacement value by 50% is determined as an FF value for the electronic component mount position Pn. The greater the numeral of the weight becomes, the closer to an actual print position of the solder section 6 the electronic component 16 comes to be mounted. As above, a coefficient that is to be multiplied by the print displacement value and that is used for generating information about corrections on coordinates for mounting the electronic component 16 can be set for each electronic component mount position Pn on the setup screen.

A numeral input to the "FF weight" 27 is empirically determined in consideration of factors, like a size of an electronic component mounted on the electronic component mount position Pn and the size of a predictive print displacement value. There are the following tendencies. A large numeral which enables an electronic component to be mounted at a position close to the solder print coordinates 6* is set in connection with the electronic component mount position Pn where a self-alignment effect on the electronic component caused by the molten solder can be expected. A small numeral which enables the electronic component to be mounted at a position close to the component mount coordinates 5* is set in connection with the electronic component mount position where the self-alignment effect cannot be expected. In the case of; for instance, a large-size component, like a connector component, which is expected to be less susceptible to the effectiveness of the self-alignment effect, mount quality will be enhanced by mounting the electronic component at the component mount coordinates 5* on the substrate 4 as a target. Accordingly, it is preferable for such the electronic component mount position Pn to exclude a target from which an FF value is to be computed. In this regard, the operator can easily make a decision by visually checking the "component size" 23 on the mount position list screen 14a.

The mount position selection screen 14b is now described by reference to FIG. 12. The mount position selection screen 14b is used as a setup screen when the electronic component mount position Pn to be computed is selected by reference to a graphical image of the substrate 4. Information including a "substrate image display field" 29, an "FB setup" 30, an "FB weight" 31, an "FF setup" 32, an "FF weight" 33, and a "list" 34 is displayed on the mount position selection screen 14b.

The "substrate image display field" 29 displays a graphical image 29a of the substrate 4 including positional information about the electronic component mount position Pn. A desired position or range on the graphical image 29a is designated via the input section 13, where the electronic component mount position Pn to be computed can be selected. As illustrated in FIG. 12, electronic component mount positions Pn (P21 to P25 are exemplified) on the selected graphical image 29a are surrounded with broken lines.

The "FB setup" 30 is an operation switch for setting the electronic component mount position Pn selected in the "substrate image display field" 29 as a target for which an FB value is to be computed. The "FB weight" 31 enables inputting of a weight of the print displacement value to be used for computing an FB value within a range from 1 to 100 in relation to the electronic component mount position Pn selected in the "substrate image display field" 29.

The "FF setup" 32 is an operation switch for setting the electronic component mount position Pn selected in the "substrate image display field" 29 as a target for which an FF value is to be computed. The "FF weight" 33 enables inputting of a weight used for computing an FF value within the range from 1 to 100 in relation to the electronic component mount position Pn selected in the "substrate image display field" 29. As above, the mount position selection screen 14b enables comprehensive setting of the weight of the print displacement value to each of the selected electronic component mount positions Pn.

The "list" 34 is an operation switch for switching the display section 14 from the mount position selection screen 14b to the mount position list screen 14a. As illustrated in FIG. 13, if at this time there are electronic component mount positions Pn selected in the "substrate image display field" 29, backgrounds of the electronic component mount positions Pn (P21 to P25 are exemplified) on the mount position list screen 14a will be highlighted.

Specific operation procedures for setting, on the mount position selection screen 14b, various conditions including the electronic component mount position Pn used in generation of an FB value and a weight include first selecting a desired electronic component mount position Pn on the "substrate image display field" 29 and then inputting a weight in the "FB weight" 31. After computation requirements are set by operation of the "FB setup" 30, the "list" 34 is operated. Various settings required at the time of generation of the component mount coordinate correction file 15 are also set by following the same procedures.

As described above, in the present embodiment, the electronic component mount position Pn (the first component mount position) used for generating an FB value and the electronic component mount position Pn (the second component mount position) used for generating the component mount coordinate correction file 15 can be individually set through the display section 14. After completion of the settings, the "set" 19 is clicked, whereby information abut the first component mount position is set in the substrate mask positioning correction value computing section 10a, and information about the second component mount position is set in the component mount coordinate correction value computing section 10b. Thus, the arithmetic processing section 10 and the display section 14 that perform display processing serve as electronic component mount position setup screen display means that displays a screen used for setting the first electronic component mount position and/or the second electronic component mount position in relation to the plurality of electronic component mount positions Pn on the substrate 4.

The component mounting system of the embodiment has a configuration, such as that mentioned above, and a series of processes for mounting electronic components on a substrate are now described. To begin with, the feedback/feedforward setup section 10c is activated, and there is performed operation for setting the first component mount position and the second component mount position while the mount position list screen 14a and the mount position selection screen 14b displayed on the display section 14 are being operated (ST1: a feedback/feedforward setup step.

Settings are performed so that electronic component mount positions Pn entailing a high degree of difficulty in mounting are included in the first component mount positions. The feedback/feedforward setup section 10c sets the information about the thus-set first component mount positions to the substrate mask positioning correction value computing section 10a. In the embodiment, the electronic component mount positions P21 to P25 that exist in the narrow adjacent area E1 illustrated in FIG. 3 are set as the first component mount positions.

Settings are also made in such a way that the second component mount positions include the electronic component mount positions Pn for which occurrence of a mounting failure is desired to be prevented by means of feedforward. The feedback/feedforward setup section 10c sets the information about the second component mount positions in the component mount coordinate correction value computing section 10b.

Figure 7:
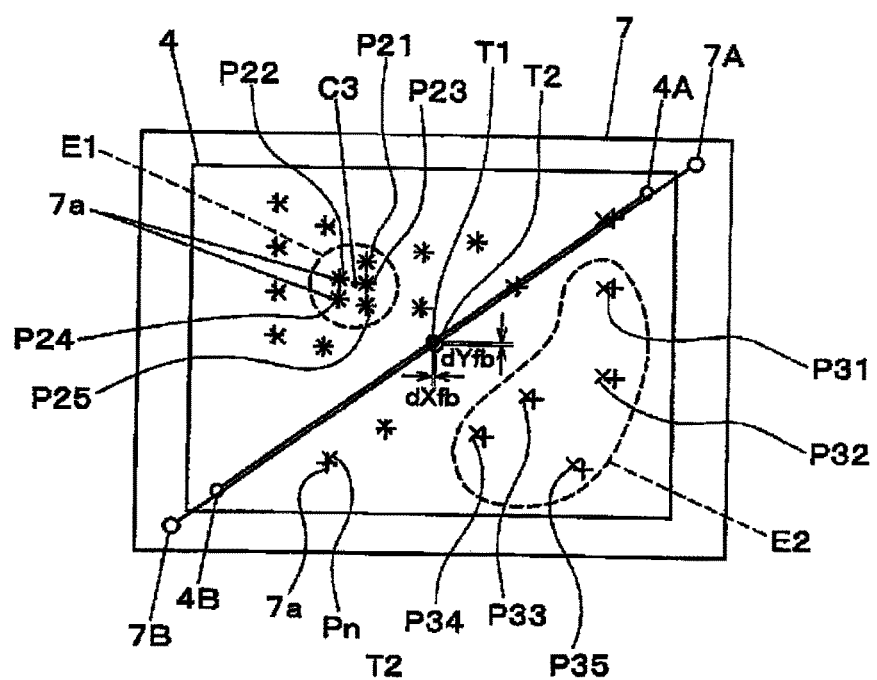
FIG. 7 is an explanatory view of operation for positioning the substrate to the mask in the embodiment of the present invention.

In the embodiment, the amounts of print displacement values at the electronic component mount positions P21 to P25 of the narrow adjacent area E1 are reduced by an effect of feedback of the FB value. Hence, an effect of feedback is considered to be restrictive. Accordingly, the electronic component mount positions P21 to P25 are eliminated from setting of the second component mount positions. In the meantime, the substrate and the mask are positioned with a focus on the narrow adjacent area E1, whereby print displacement values at the electronic component mount positions P31 to P35 located in the wide spacing area E2 illustrated in FIG. 3 become great (FIG. 6 and FIG. 7). Therefore, occurrence of a mounting failure needs to be prevented by active application of feedforward that uses the FF values. As a consequence, the electronic component mount positions P31 to P35 are set to the second component mount positions.

After the feedback/feedforward setup section 10c has finished performing setting, the substrate 4 is conveyed to the printing machine M1, where the substrate is subjected to screen printing. Specifically, the mask 7 in which there are formed a plurality of apertures and the substrate 4 are positioned, and the solder sections 6 are formed on the respective electrodes 5 formed at the plurality of electronic component mount positions Pn set on the substrate 4 via the apertures (ST2: a solder section formation step).

Next, the substrate 4 having undergone screen printing is conveyed to the print inspection machine M2, where the substrate is subjected to various types of inspections including performance of a determination as to whether a printed state is defective or non-defective, and inspection data 8 are generated. More specifically, the substrate 4 on which the solder sections 6 are formed is inspected, whereby inspection data 8 including print displacement values of the solder sections 6 occurred in the plurality of electronic component mount positions Pn are generated (ST3: an inspection data generation step).

The substrate 4 having finished undergone inspection is conveyed, by way of the work conveyor M3, to the mounting machines M4 and M5 where the electronic components 16 are mounted on the substrate 4. In short, the electronic components 16 are mounted at the plurality of electronic component mount positions Pn on the substrate 4 having finished undergoing inspection (ST4: an electronic component mounting step). Subsequently, the substrate 4 is conveyed to the reflow machine, where the substrate is heated. The electronic components 16 and the substrate 4 are thereby soldered, and a mounted substrate is completed.

The inspection data 8 generated in (ST3) are output to the mounting line control section 3, and the substrate mask positioning correction value computing section 10a generates an FB value. More specifically, there is prepared information about corrections on control parameters pertinent to positioning of the mask 7 to the substrate 4 that is performed when the solder sections 6 are formed on the basis of the inspection data 8; namely, the FB value (ST5: a feedback processing step).

During generation of the FB value, an average value of products (a print displacement value×a weight) of the electronic component mount positions Pn selected for the first component mount position is calculated, and the thus-computed average is taken as an FE value (dXfb, dYfb). In the embodiment, an average of the print displacement values at the electronic component mount positions P21 to P25 that exist in the narrow adjacent area E1 illustrated in FIG. 3 is generated as an FE value. The FE value is fed back to the printing machine M1, and the printing machine M1 makes corrections to the control parameters in accordance with the received FB value (including overwriting the control parameters with the FB value), and subsequently the mask 7 and the substrate 4 are positioned.

Figure 8:
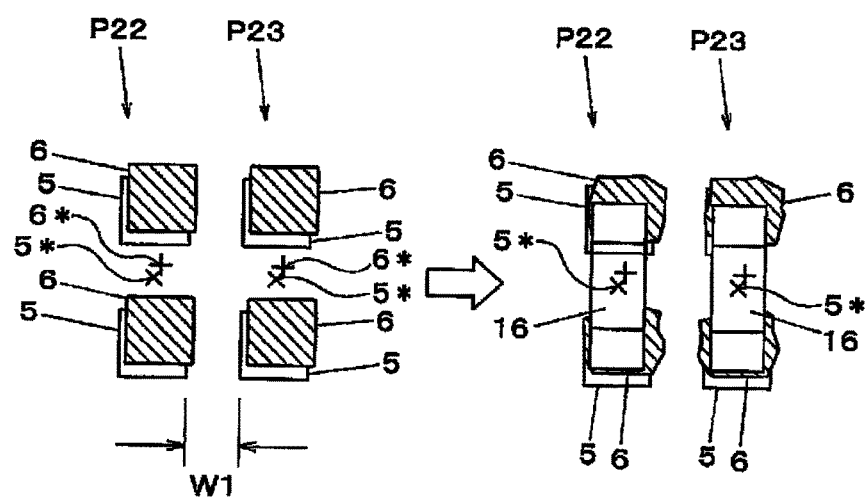
FIG. 8 is an explanatory view showing operation for mounting electronic components in the embodiment of the present invention.

When corrections are made to the control parameters in accordance with the FB value, the mask 7 and the substrate 4 are positioned while the middle points T1 and T2 are displaced by an amount corresponding to the FE value (dXfb, dYfb) as illustrated in FIG. 7. Specifically, a positioning center C is set at a predetermined position within the narrow adjacent area E1, and the mask and the substrate are positioned while the electrodes 5 of the electronic component mount positions P21 to P25 and the apertures of the mask 7 are substantially aligned to each other. Consequently, even when the solder sections are displaced from the designed component mount coordinates 5* of the electronic component mount positions P21 to P25 in the narrow adjacent area E1 as a result of occurrence of a warpage in a part of the substrate 4, the print displacement value of the solder sections 6 with respect to the electronic component mount positions P21 to P25 can be prevented. FIG. 8 shows print positions of the solder sections 6 on the electronic component mount positions P22 and P23 when screen printing is carried out after corrections have been made to the control parameters in accordance with the FB value.

In conjunction with generation of the FB values, the component mount coordinate correction value computing section 10b generates the component mount coordinate correction file 15. To be specific, there is generated information about corrections on the electronic component mount coordinates used when the electronic components are mounted in accordance with the inspection data 8; namely, the component mount coordinate correction file 15 (ST6: a feedforward processing step). During generation of the component mount coordinate correction file 15, there is computed a value that is determined by multiplying the print displacement value by a weight for each of the electronic component mount positions Pn set at the second electronic component mount position. The thus-computed value is adopted as an FF value.

The mounting machines M4 and M5 confirm identification information about the conveyed substrate 4 and read the corresponding component mount coordinate correction file 15 from the component mount correction value storage section 12. The electronic components are mounted in accordance with the FF value recorded in the component mount coordinate correction file 15. As illustrated in FIG. 8, in the embodiment, the FF value is not set on the electronic component mount positions P22 and P23. Therefore, the electronic components 16 are not mounted at positions that are targeted at the component mount coordinates 5*. The same also applies to the electronic component mount positions P21, P24, and P25.

After corrections are made to the mount coordinates for the electronic components 16 in accordance with the FF value of the component mount coordinate correction file 15, the electronic components 16 are mounted on the electronic component mount positions P31 to P35.

The substrate 4 on which the electronic components are mounted is delivered to the (unillustrated) reflow machine, where the substrate 4 is heated according to a predetermined temperature profile. Solder particles included in the solder sections are melted by heating, whereby the electronic components and the substrate are soldered.

Although the mounted substrate on which the electronic components are mounted through the above steps is generated, processing pertaining to the feedback/feedforward setup step is performed as required according to a state of generation of mounting failures, thereby changing the electronic component mount positions Pn to be set on the first electronic component mount position and the second electronic component mount position or making a correction to the weight.

As above, the substrate mask positioning correction value computing section 10a generates an FE value from the print displacement values of the preset first electronic component mount position. Moreover, the component mount coordinate correction value computing section 10b generates a component mount coordinate correction file 15 from the preset second electronic component mount position. Even the warped substrate 4 or the substrate 4 that includes in part the electronic component mount positions Pn entailing a high degree of difficulty in mounting can also be appropriately addressed.

In addition, in the embodiment, the FB value is generated from print displacement values at the electronic component mount positions Pn entailing a high degree of difficulty in mounting. Hence, screen printing is performed by making corrections to the control parameters in accordance with the FB value, so that occurrence of the print displacement values of the solder sections 6 at the electronic component mount positions Pn entailing a high degree of difficulty in mounting can be prevented even when warpage exists in part of the substrate 4.

Figure 15:
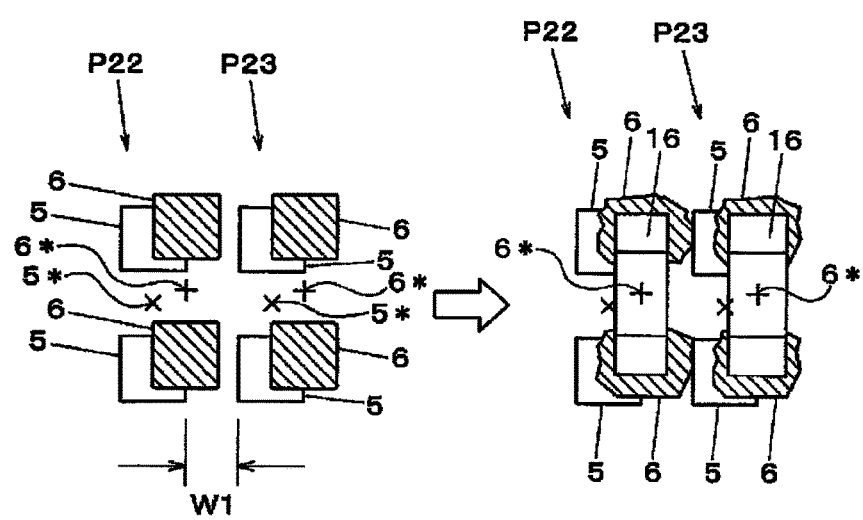
FIG. 15 is an explanatory view showing operation for mounting electronic components in the embodiment of the present invention.

Effectiveness of generating the FE value under the foregoing method is now described more specifically. For instance, when an average of the print displacement values of all the electronic component mount positions Pn on the substrate 4 is taken as an FB value, positional displacement of the solder sections 6 is solved in its entirety. However, as illustrated in FIG. 15, print displacement values that cannot be overlooked still remain in the electronic component mount positions P22 and P23 entailing a high degree of difficulty in mounting and where narrow spacing W1 exists between the adjacent electrodes 5.

To be specific, when the electronic components 16 are mounted at positions (the solder print coordinates 6*) of the solder sections 6 that are printed while displaced from the electronic component mount positions P22 and P23 by a given amount, the solder sections 6 will lose their shapes during mounting, which may contact the adjacent electrodes 5. If the substrate is subjected reflow in that state, a short circuit will occur in an electronic circuit, which may induce a mounting failure. This may become noticeable when a warpage exists in the substrate 4 or when the narrow adjacent area E1 and the wide spacing area E2 coexist in the substrate 4. The problem can be solved by preventing occurrence of the print displacement values of the solder sections 6 at the electronic component mount positions P22 and P23, by use of the FB value generated under the method described in connection with the embodiment.

The electronic component mounting system of the embodiment enables the operator to easily set, on the same screen, the electronic component mount positions Pn used in the substrate mask positioning correction value computing section 10a and the component mount coordinate correction value computing section 10b while, visually ascertaining the electronic component mount positions Pn through the display section 14. Further, the electronic component mount positions Pn to be computed by the substrate mask positioning correction value computing section 10a and the component mount coordinate correction value computing section 10b are individually selected the operator, and the weight is set for each electronic component mount position Pn, by the operator, whereby high quality mounting can be implemented.

The first electronic component mount position and the second electronic component mount position can also be set in numbers. Further, the electronic component mount position Pn to be set on the first electronic component mount position and the second electronic component mount position may have an overlap between the first and second electronic component mount position. More specifically, one electronic component mount position Pn can also be set on both the first electronic component mount position and the second electronic component mount position. Moreover, the methods for setting the first electronic component mount position, the second electronic component mount position, and the weight are not limited to those mentioned in connection with the embodiments.

According to the embodiment, even a warped substrate and a substrate which has in part electronic component mount positions entailing a high degree of difficulty in mounting can also be appropriately addressed, so that the embodiment is useful particularly in a field of mounting electronic components.

What is claimed is:

1. An electronic component mounting system that mounts electronic components at a plurality of electronic component mount positions including first electronic component mount positions and second electronic component mount positions on a substrate, to thus manufacture a mounted substrate, the system comprising:

a screen printing device that positions a mask in which a plurality of apertures are formed to the substrate and that forms solder sections on electrodes formed at the plurality of electronic component mount positions on the substrate via the apertures;

an inspection device that inspects the substrate on which the solder sections are formed and that generates inspection data including print displacement values of the solder sections at the plurality of electronic component mount positions, the print displacement values including a first print displacement value at each of the first electronic component mount positions and a second print displacement value at each of the second electronic component mount positions;

an electronic component mounting device that mounts electronic components at the plurality of electronic component mount positions on the substrate having finished undergoing inspection in the inspection device;

a feedback part that generates, based on the inspection data, first information about corrections on control parameters pertinent to positioning of the mask to the substrate in the screen printing device; and a feedforward part that generates, based on the inspection data, second information about corrections on electronic component mount coordinates in the electronic component mounting device, wherein the feedback part generates, based on the first print displacement value at each of the first electronic component mount positions, the first information about the corrections on the control parameters pertinent to positioning of the substrate to the mask, and the feedforward part generates, based on the second print displacement value at each of the second electronic component mount positions, the second information about the corrections on the electronic component mount coordinates in the electronic component mounting device, wherein each of the first electronic component mount positions has a higher degree of mounting difficulty than each of the second electronic component mount positions.

2. The electronic component mounting system according to claim 1, wherein the first electronic component mount positions include at least electronic component mount positions to which micro-components are to be mounted.

3. The electronic component mounting system according to claim 1, further comprising an electronic component mount position setup screen display part that displays a setup screen for setting each of the first electronic component mount positions and/or each of the second electronic component mount positions with respect to the plurality of electronic component mount positions on the substrate.

4. The electronic component mounting system according to claim 3, wherein a coefficient to be multiplied by the first print displacement value used for generating the first information about the corrections on the control parameters pertinent to positioning of the mask to the substrate can be set on the setup screen for each of the first electronic component mount positions.

5. The electronic component mounting system according to claim 3, wherein a coefficient to be multiplied by the second print displacement value used for generating the second information about the corrections on the electronic component mount coordinates can be set on the setup screen for each of the second electronic component mount positions.

6. The electronic component mounting system according to claim 1, further comprising a setting part that receives an input from an operator and sets the first electronic component mount positions and/or the second electronic component mount positions in accordance with the input, wherein the feedback part generates the first information based on the first print displacement value at each of the first electronic component mount positions set by the setting part, and the feedforward part generates the second information based on the second print displacement value at each of the second electronic component mount positions set by the setting part.

7. The electronic component mounting system according to claim 6, wherein the setting part sets a first coefficient to be multiplied by the first print displacement value used for generating the first information for each of the first electronic component mount positions, and the feedback part generates the first information based on the first print displacement value multiplied by the first coefficient set by the setting part.

8. The electronic component mounting system according to claim 6, wherein the setting part sets a second coefficient to be multiplied by the second print displacement value used for generating the second information for each of the second electronic component mount positions, and the feedback part generates the second information based on the second print displacement value multiplied by the second coefficient set by the setting part.

9. An electronic component mounting method for manufacturing a mounted substrate by mounting electronic components on a substrate by an electronic component mounting system that mounts the electronic components on the substrate at a plurality of electronic component mount positions including first electronic component mount positions and second electronic component mount positions, to thus manufacture the mounted substrate, the method comprising:

a solder section formation step of positioning the mask in which a plurality of apertures are formed to the substrate and forming solder sections on electrodes formed at the plurality of electronic component mount positions on the substrate via the apertures;

an inspection data generation step of inspecting the substrate on which the solder sections are formed and generating inspection data including print displacement values of the solder sections at the plurality of electronic component mount positions, the print displacement values including a first print displacement value at each of the first electronic component mount positions and a second print displacement value at each of the second electronic component mount positions;

an electronic component mount step of mounting electronic components at the plurality of electronic component mount positions on the substrate having finished undergoing inspection;

a feedback processing step of generating, based on the inspection data, information about corrections on control parameters pertinent to positioning of the mask to the substrate in the solder section formation step; and a feedforward processing step of generating, based on the inspection data, information about corrections on electronic component mount coordinates in the electronic component mount step, wherein in the feedback processing step, the information about the corrections on the control parameters pertinent to positioning of the substrate to the mask is formed, based on the first print displacement value at each of the first electronic component mount positions, and in the feedforward processing step, the information about the corrections of the electronic component mount coordinates in the electronic component mounting device is formed, based on the second print displacement value at each of the second electronic component mount positions, wherein each of the first electronic component mount positions has a higher degree of mounting difficulty than each of the second electronic component mount positions.

10. The electronic component mounting method according to claim 9, wherein the first electronic component mount positions include at least electronic component mount positions to which micro-components are to be mounted.

* * * * *